United States Patent
Ellis-Monaghan et al.

(10) Patent No.: US 9,397,174 B2
(45) Date of Patent: Jul. 19, 2016

(54) SELF-ALIGNED GATE ELECTRODE DIFFUSION BARRIERS

(71) Applicant: International Business Machines Corporation, Armonk, NY (US)

(72) Inventors: John J. Ellis-Monaghan, Grand Isle, VT (US); Jeffrey P. Gambino, Westford, VT (US); Russell T. Herrin, Essex Junction, VT (US); Laura J. Schutz, Burlington, VT (US); Steven M. Shank, Jericho, VT (US)

(73) Assignee: GLOBALFOUNDRIES INC., Grand Cayman (KY)

(*) Notice: Subject to any disclaimer, the term of this patent is extended or adjusted under 35 U.S.C. 154(b) by 0 days.

(21) Appl. No.: 14/516,623

(22) Filed: Oct. 17, 2014

(65) Prior Publication Data

US 2015/0035076 A1    Feb. 5, 2015

Related U.S. Application Data

(62) Division of application No. 13/904,060, filed on May 29, 2013, now Pat. No. 8,932,920.

(51) Int. Cl.
*H01L 27/092* (2006.01)
*H01L 29/40* (2006.01)
*H01L 21/8238* (2006.01)

(52) U.S. Cl.
CPC .......... *H01L 29/408* (2013.01); *H01L 21/8238* (2013.01); *H01L 21/823842* (2013.01); *H01L 21/823871* (2013.01); *H01L 27/092* (2013.01)

(58) Field of Classification Search
CPC ................. H01L 21/823842; H01L 21/823828–21/82385

USPC ........................... 257/369–377; 438/199–233
See application file for complete search history.

(56) References Cited

U.S. PATENT DOCUMENTS

| | | | | |
|---|---|---|---|---|
| 4,786,611 A * | 11/1988 | Pfiester | .......................... | 438/233 |
| 5,382,532 A | 1/1995 | Kobayashi et al. | | |
| 5,527,721 A | 6/1996 | Farb | | |
| 5,550,079 A * | 8/1996 | Lin | ............................... | 438/587 |
| 5,633,523 A * | 5/1997 | Kato | ............................. | 257/369 |
| 6,552,400 B2 * | 4/2003 | Tomita | .......................... | 257/371 |

(Continued)

FOREIGN PATENT DOCUMENTS

| CN | 101452956 A | 6/2009 |
|---|---|---|
| CN | 101452956 B | 6/2011 |

(Continued)

OTHER PUBLICATIONS

U.S. Appl. No. 13/904,060, entitled: "Self-Aligned Gate Electrode Diffusion Barriers", filed, May 29, 2013.

(Continued)

*Primary Examiner* — Eric Ward
(74) *Attorney, Agent, or Firm* — Michael Lestrange; Andrew M. Calderon; Roberts Mlotkowski Safran & Cole, P.C.

(57) ABSTRACT

A structure that provides a diffusion barrier between two doped regions. The structure includes a diffusion barrier including a semiconductor layer comprising a first doped region and a second doped region; and a diffusion barrier separating the first doped region and the second doped region, wherein the diffusion barrier comprises a doped portion and a notch above the doped portion.

5 Claims, 16 Drawing Sheets

(56) References Cited

U.S. PATENT DOCUMENTS

| | | |
|---|---|---|
| 6,602,746 B2 * | 8/2003 | Tanaka .......................... 438/201 |
| 6,670,680 B2 * | 12/2003 | Nohsoh et al. ................ 257/369 |
| 7,361,932 B2 * | 4/2008 | Tsuzumitani ..... H01L 21/28052 257/369 |
| 7,528,451 B2 * | 5/2009 | Zhu .................. H01L 21/28044 257/385 |
| 7,569,446 B2 | 8/2009 | Doris et al. |
| 7,635,881 B2 | 12/2009 | Kuo |
| 7,671,421 B2 | 3/2010 | Chen et al. |
| 7,790,542 B2 | 9/2010 | Dyer et al. |
| 7,825,482 B2 | 11/2010 | Okazaki et al. |
| 7,943,452 B2 * | 5/2011 | Li et al. ........................ 438/199 |
| 7,943,453 B2 | 5/2011 | Kastenmeier et al. |
| 8,232,154 B2 | 7/2012 | Chien et al. |
| 8,796,130 B2 | 8/2014 | Gambino et al. |
| 2007/0069304 A1 * | 3/2007 | Aida ................. H01L 21/28052 257/369 |
| 2008/0157215 A1 | 7/2008 | Miyashita |
| 2009/0311855 A1 | 12/2009 | Bruff et al. |
| 2010/0252881 A1 | 10/2010 | Onsongo et al. |
| 2011/0248341 A1 | 10/2011 | Ring |

FOREIGN PATENT DOCUMENTS

| | | |
|---|---|---|
| KR | 101082101 B1 | 11/2011 |
| WO | WO2009134412 A1 | 11/2009 |

OTHER PUBLICATIONS

Pawlak et al., "Suppression of phosphorus diffusion by carbon co-implantation", Applied Physics Letters 89, 062102 (2006); doi: 10.1063/1.2234315.

Schwalke et al., "Advanced Gate-Stack Architecture for Low-Voltage Dual-Workfunction CMOS Technologies with Shallow Trench Isolation" Siemens, Corp. R&D, Microelectronics, 1997 Symposium on VLSI Technology Digest of Technical Papers, pp. 71-72.

* cited by examiner

SELF-ALIGNED GATE ELECTRODE DIFFUSION BARRIERS

CROSS-REFERENCE

The present application is a divisional of, and claims priority under 35 U.S.C. §120, U.S. patent application Ser. No. 13/904,060, filed on May 29, 2013, which is incorporated by reference in its entirety.

BACKGROUND

The present invention generally relates to semiconductor devices structures, and particularly to the fabrication of self-aligned gate electrode diffusion barriers.

In complementary metal-oxide semiconductor (CMOS) technology, an n-type field-effect transistor (nFET) and a p-type field effect transistor (pFET) may be paired together. As CMOS technology continues to shrink, the space between the nFET and the pFET may also continue to shrink. One technique to reduce the space required of an nFET/pFET pair is to have both transistors share a common gate. For example, referring to FIG. 1, a CMOS device 10 may include an nFET 11 and a pFET 12 formed on a semiconductor substrate 13. The nFET 11 may include nFET source/drains 14, while the pFET 12 may include pFET source/drains 15. The nFET 11 and the pFET 12 may share a common gate 16.

In part to allow for a decreased thickness of the gate dielectric layers, the gates of pFETs and nFETs may be doped with p-type and n-type dopants. For instance, the common gate 16 may include an n-doped portion 17 for the nFET 11 and a p-doped portion 18 for the pFET 12. However, as depicted in FIG. 2, it may be possible for dopants to diffuse from the p-doped portion 18 to the n-doped portion 17, or vice versa, particularly during periods of high temperature. Should the dopants diffuse too far toward either the opposite device, the CMOS device 10 may suffer from reduced performance or fail to operate entirely. Therefore a method of preventing dopant diffusion between the nFET portion and the pFET portion of a shared common gate of a CMOS device may be, among other things, desirable.

BRIEF SUMMARY

The present invention relates to self-aligned diffusion barriers and methods of forming the same. According to an exemplary embodiment, a self-aligned diffusion barrier between a first doped region and a second doped region may be formed by forming a first masking layer above a first portion of the semiconductor layer. The first masking layer may have a vertical sidewall on the semiconductor layer. A first spacer layer may be formed above the semiconductor layer and the first masking layer. The first spacer layer may include a spacer region on the vertical sidewall of the first masking layer. A second portion of the semiconductor layer not covered by the first masking layer and not covered by the spacer region may then be doped. A second masking layer may then be formed over the first spacer layer and planarized to expose at least a portion of the spacer region. The spacer region may then be etched to form a notch exposing a third portion of the semiconductor layer between the first portion and the second portion. The third portion may then be doped with a barrier dopant. The first masking layer may be removed and a second spacer layer that fills the notch may be formed over the second masking layer. The first portion of the semiconductor layer may then be doped.

According to another exemplary embodiment, a CMOS structure may be formed by first forming a gate electrode layer above a semiconductor substrate. The semiconductor substrate may contain a first active region and a second active region separated from the first active region by an inactive region. The first active region and the second active region may be oppositely doped. A first masking layer may be formed above the gate electrode layer above the first active region. A first spacer layer, including a spacer region above the inactive region, may then be formed above the gate electrode layer and the first masking layer. The gate electrode layer may be doped above the second active region with a first dopant of opposite type as the second active region. The spacer region and the first masking layer may prevent the first dopant from entering the gate electrode layer above the first active region or the inactive region. A second masking layer may be formed above the first spacer layer and then planarized to expose at least a portion of the spacer region. The spacer region may then be etched to expose a portion of the gate electrode layer above the inactive region. The exposed portion of the gate electrode layer may be doped with a barrier to dopant to form a barrier region in the gate electrode layer. The first masking layer may be removed and a second spacer layer may be formed above the barrier region before doping the gate electrode layer above the first active region with a second dopant of opposite type as the first active region. The second spacer layer and the second masking layer may prevent the second dopant from entering the gate electrode layer above the first active region and the barrier region.

According to another exemplary embodiment, a semiconductor structure may include a semiconductor layer including a first doped region, a second doped region, and a diffusion barrier separating the first doped region and the second doped region. The diffusion barrier may include a doped portion and a notch above the doped portion.

BRIEF DESCRIPTION OF THE SEVERAL VIEWS OF THE DRAWINGS

The following detailed description, given by way of example and not intend to limit the invention solely thereto, will best be appreciated in conjunction with the accompanying drawings, in which.

Figure 1:
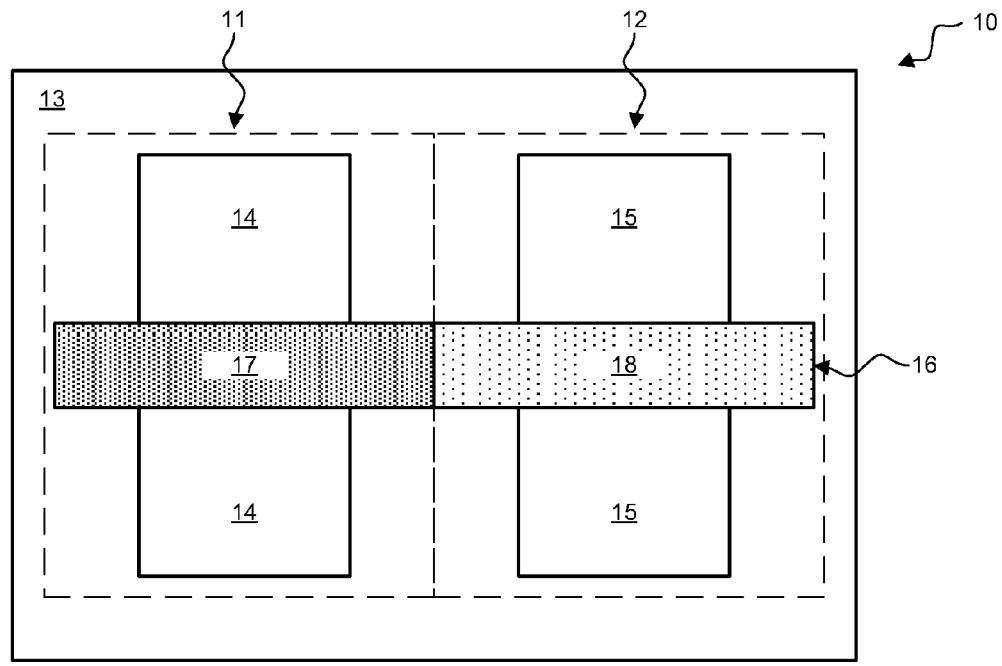
FIG. 1 is a top view of a CMOS device having a common gate, according to the prior art.
Figure 2:
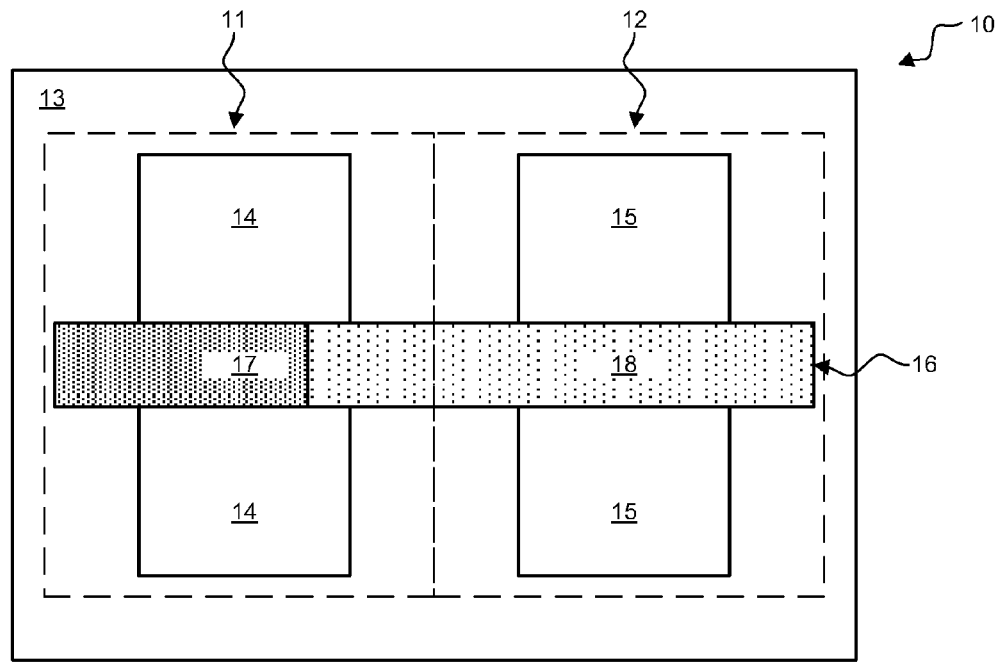
FIG. 2 is a top view of a CMOS device having a common gate where dopants have diffused from the p-doped portion of the common gate to the n-doped portion of the common gate, according to the prior art.

Elements of the figures are not necessarily to scale and are not intended to portray specific parameters of the invention. For clarity and ease of illustration, scale of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Exemplary embodiments will now be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

Embodiments of the invention generally relate to methods of forming self-aligned diffusion barriers between the pFET region and the nFET region of a shared semiconductor gate of a CMOS transistor pair. While the depicted embodiments discussed below relate to a CMOS transistor pair, it will be understood that embodiments are not limited to only those including a shared semiconductor gate of a CMOS transistor pair. Embodiments of the invention further include forming a self-aligned diffusion barrier in a semiconductor layer between a first doped region in the semiconductor layer and a second doped region in the semiconductor layer.

Figure 3A:
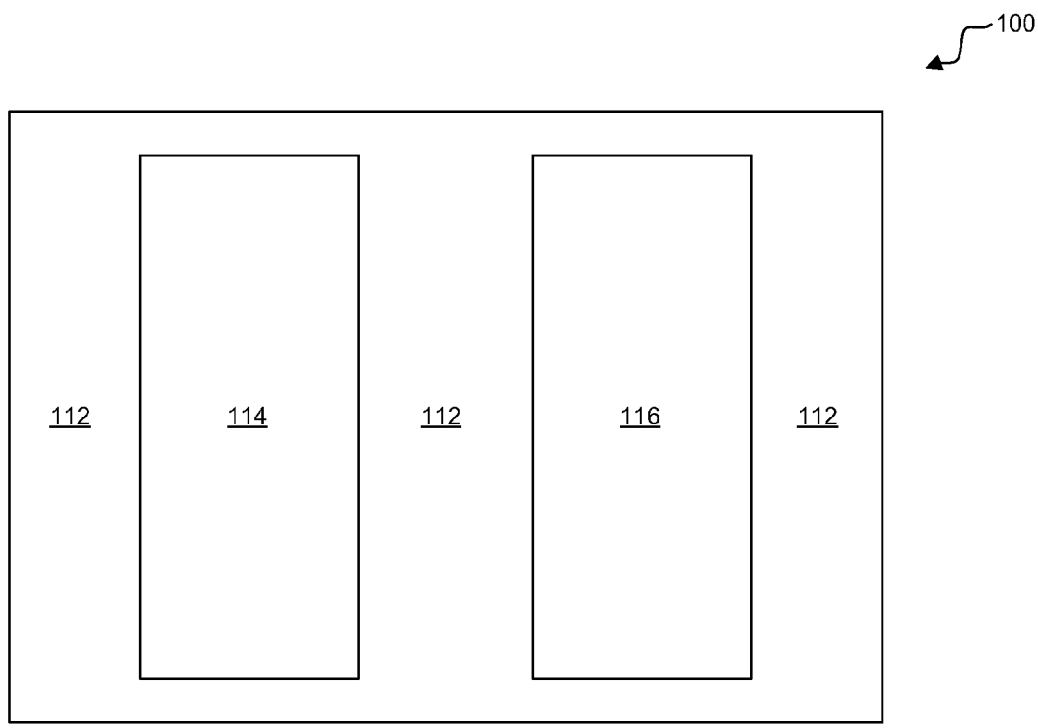
FIG. 3A is a top view of a semiconductor structure including a semiconductor substrate, according to an embodiment of the present invention.
Figure 3B:
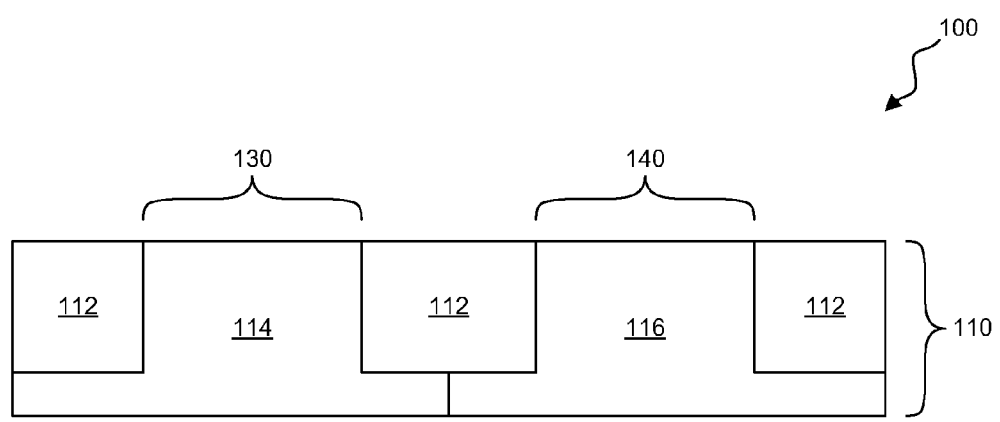
FIG. 3B is a cross-sectional view of the semiconductor structure of FIG. 3A.

Referring to FIGS. 3A-3B, a semiconductor structure 100 including a substrate layer 110 may be provided or formed using typical methods known to one of ordinary skill in the art. The substrate layer 110 may include a p-well 114 (i.e. a semiconductor region doped with p-type dopants) and an oppositely-doped n-well 116 (i.e. a semiconductor region doped with n-type dopants). In some embodiments, the doping of the p-well 114 and the n-well 116 may be reversed (i.e., well 114 may be n-doped, and well 116 may be p-doped). In such embodiments, the dopants in any subsequent doping steps will also be reversed (i.e., doping steps that prescribe n-type dopants will instead use p-type dopants, and vice versa). The p-well 114 and the n-well 116 may be made from any of several known semiconductor materials such as, for example, silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. Typically the substrate layer 110 may be about, but is not limited to, several hundred microns thick. For example, the substrate layer 110 may include a thickness ranging from 0.5 mm to about 1.5 mm. The substrate layer 110 may further include additional structures, such as a buried insulator layer in the case of a semiconductor-on-insulator substrate, but these structures have been omitted from the figures for clarity.

With continued reference to FIGS. 3A-3B, in some embodiments, the substrate layer 110 may include structures for isolating the p-well 114 from the n-well 116. In the depicted embodiment, these include shallow trench isolation (STI) regions 112. The STI regions 112 may be made of an insulating material such as silicon oxide and be formed by any method known in the art. The STI regions 112 define an nFET active region 130, where the STI regions 112 do not cover the p-well 114, and a pFET active region 140, where the STI regions 112 do not cover the n-well 116. The nFET active region 130 and the pFET active region 140 extend vertically above the uncovered portions of p-well 114 and the n-well 116, respectively. Even in the absence of an insulating structure, an inactive region may exist between p-well 114 and the n-well 116.

Figure 4A:
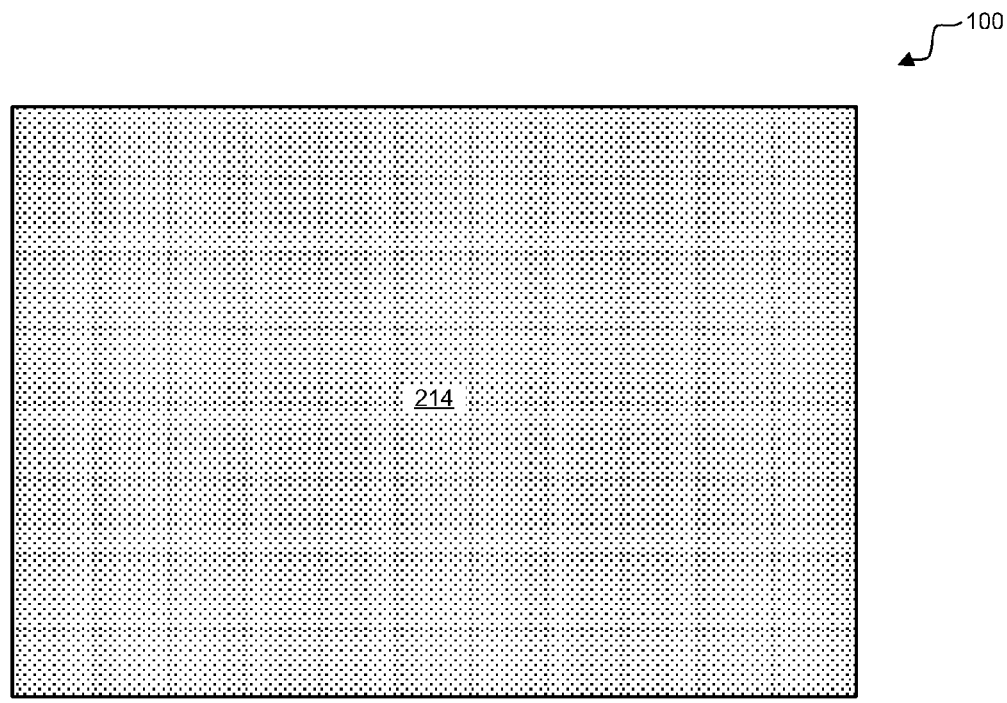
FIG. 4A is a top view and a cross-sectional view depicting forming a gate layer above the semiconductor structure, according to an embodiment of the present invention.
Figure 4B:
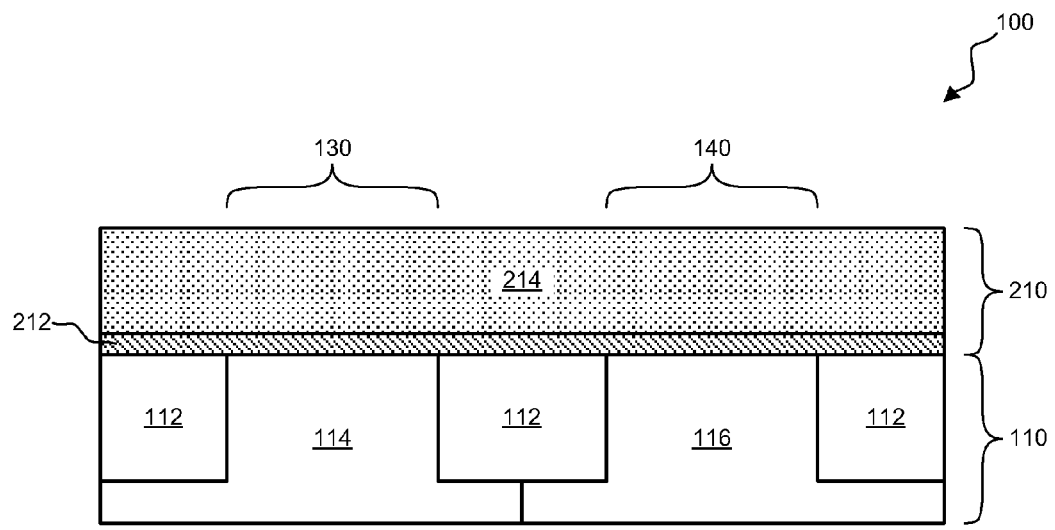
FIG. 4B is a cross-sectional view of the semiconductor structure of FIG. 4A.

Referring to FIGS. 4A-4B, a gate layer 210 may be formed above the substrate layer 100. The gate layer 210 may include a gate dielectric layer 212 and a gate electrode layer 214. The gate dielectric layer 212 may be made of gate dielectric layer materials such as metal oxides, metal silicates, metal nitrides, transition metal oxides, transition metal silicates, transition metal nitrides, or combinations thereof, and may have a thickness of approximately 1 nm to approximately 10 nm, although greater and lesser thickness are explicitly contemplated. Exemplary gate dielectric layer materials include silicon dioxide, hafnium oxide, and aluminum oxide. The gate electrode layer 214 may be a semiconductor layer made of typical semiconductor materials including, for example polysilicon, germanium, silicon-germanium alloy, carbon-doped silicon, carbon-doped silicon-germanium alloy and may have a thickness of approximately 50 nm to approximately 200 nm, although greater and lesser thickness are explicitly contemplated. In other embodiments, the gate electrode layer 214 may be any semiconductor layer in which a self-aligned diffusion barrier is desired between a first region (e.g., the nFET active region 130) in the semiconductor layer and a second region (e.g., the pFET active region 140) in the semiconductor layer.

Figure 5A:
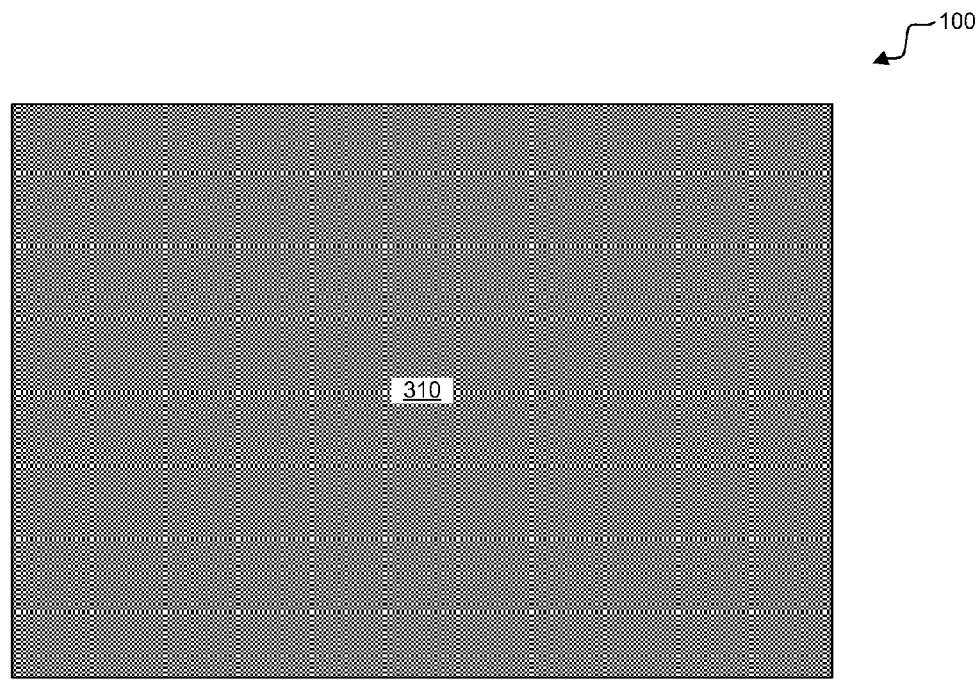
FIG. 5A is a top view and a cross-sectional view depicting forming a protective layer above the semiconductor structure, according to an embodiment of the present invention.
Figure 5B:
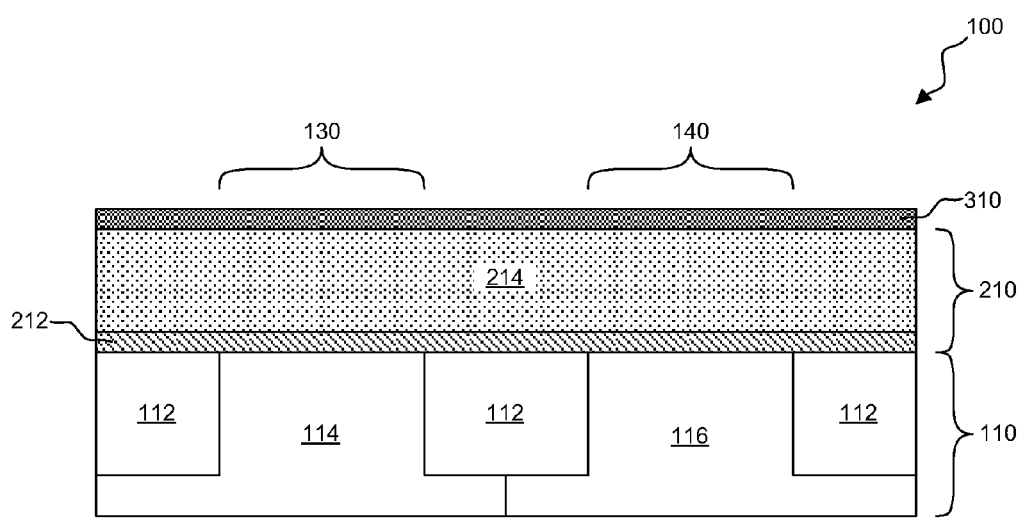
FIG. 5B is a cross-sectional view of the semiconductor structure of FIG. 5A.

Referring to FIGS. 5A-5B, a protective layer 310 may be deposited above the semiconductor structure 100. The protective layer 310 may protect the gate electrode layer 214 during subsequent fabrication process and serve as an etch stop layer to facilitate the removal of masking layers formed above the gate electrode layer 214. The protective layer 310 may be formed using any suitable deposition technique known in the art capable of forming a substantially conformal layer over the gate electrode layer 214, including, for example, chemical vapor deposition (CVD) and physical vapor deposition (PVD). The protective layer 310 may be made of any material with good etch selectivity relative to the gate electrode layer 214. In an exemplary embodiment where the gate electrode layer 214 is made of silicon, the protective layer 310 may be made of silicon nitride and have a thickness of approximately 30 nm to approximately 100 nm, though greater and lesser thickness are explicitly contemplated.

Figure 6A:
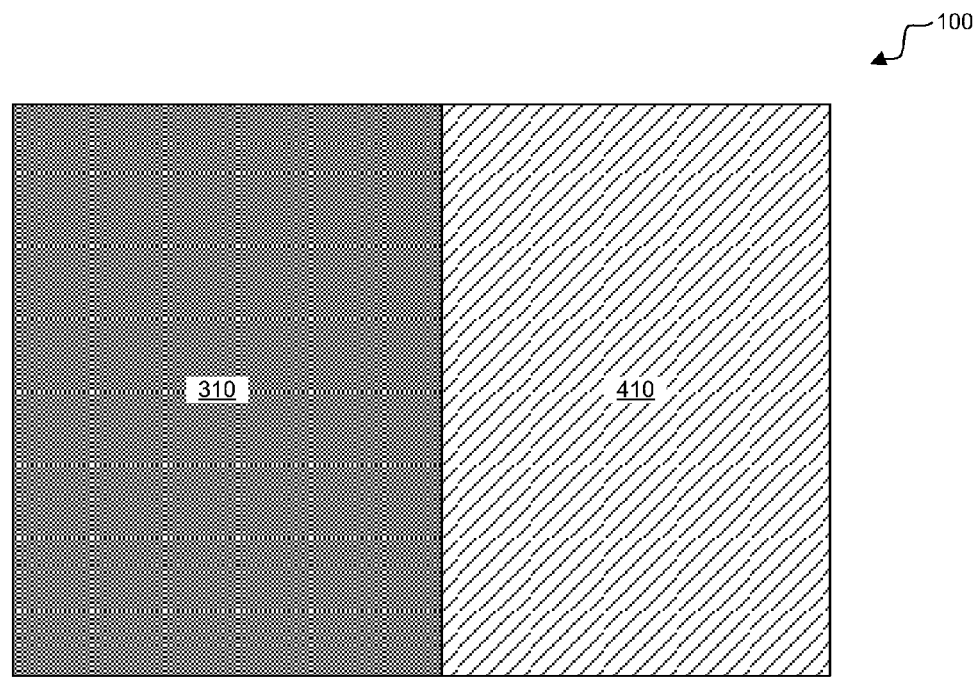
FIG. 6A is a top view and a cross-sectional view depicting forming a first masking layer above the semiconductor structure, according to an embodiment of the present invention.
Figure 6B:
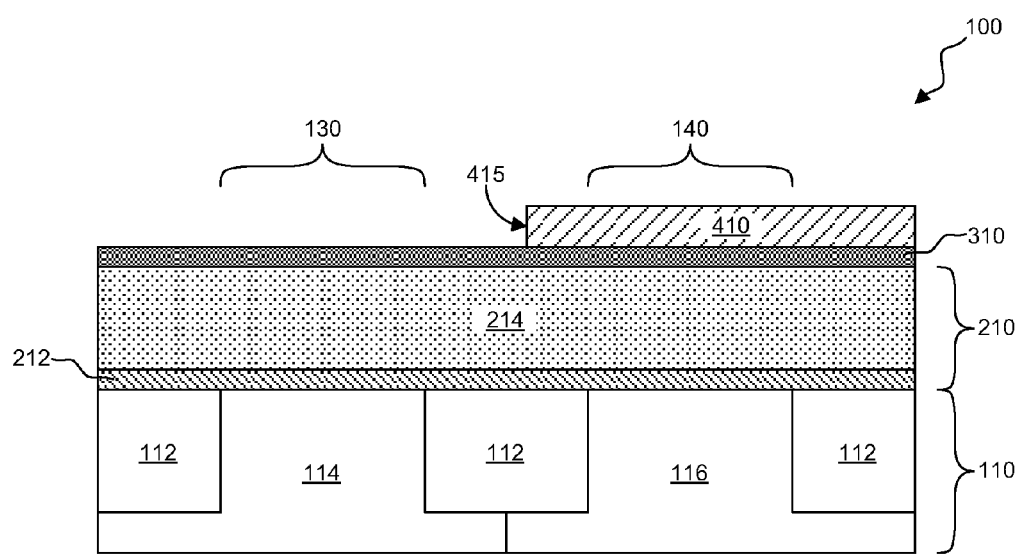
FIG. 6B is a cross-sectional view of the semiconductor structure of FIG. 6A.

Referring to FIGS. 6A-6B, a first masking layer 410 may be formed above semiconductor structure 100. The first masking layer 410 may have an end 415 located between the nFET active region 130 and the pFET active region 140. The location of the end 415 will determine the location of the self-aligned diffusion barrier subsequently formed in the gate electrode layer 214, as well as the boundary between the doped regions on either side of the diffusion barrier (FIG. 12). The first masking layer 410 may be formed using any suitable deposition technique known in the art capable of forming a substantially conformal layer over the protective layer 310, including, for example, CVD and PVD. In some embodiments, forming the first masking layer 410 may also including an etching step using a known etching technique, such as reactive ion etching (RIE) or a wet etch, to form the end 415. The first masking layer 410 may be made of any material with good etch selectivity relative to the protective layer 310 and have a thickness ranging from approximately 50 nm to approximately 200 nm, though greater and lesser thicknesses are explicitly contemplated. In embodiments where the protective layer 310 is made of silicon nitride, the first masking layer 410 may be made of, for example, silicon oxide. In other embodiments, the first masking layer 410 may be made of polysilicon or a photoresist material. The first masking layer may be formed by any suitable deposition and/or etching techniques known in the art.

Figure 7A:
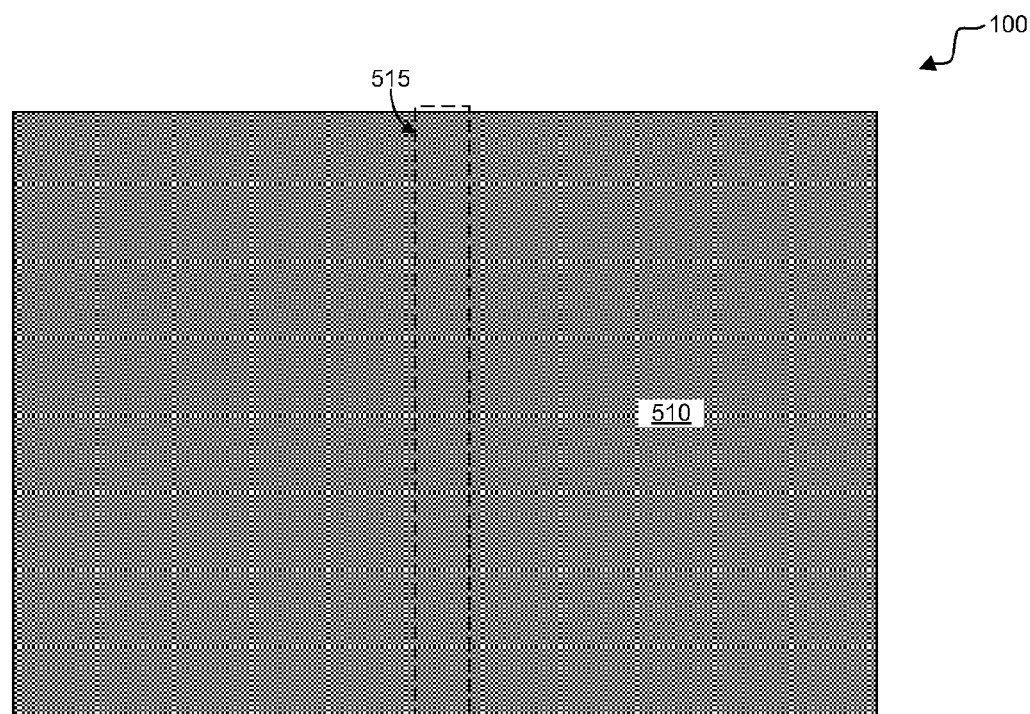
FIG. 7A is a top view and a cross-sectional view depicting forming a first spacer layer above the semiconductor structure, according to an embodiment of the present invention.
Figure 7B:
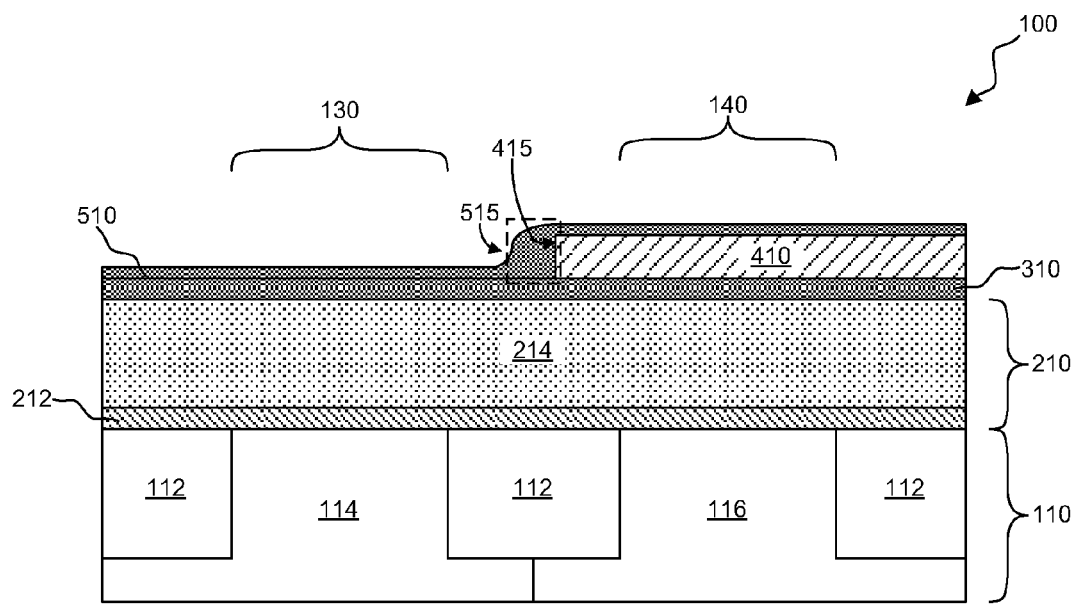
FIG. 7B is a cross-sectional view of the semiconductor structure of FIG. 7A.
Figure 9A:
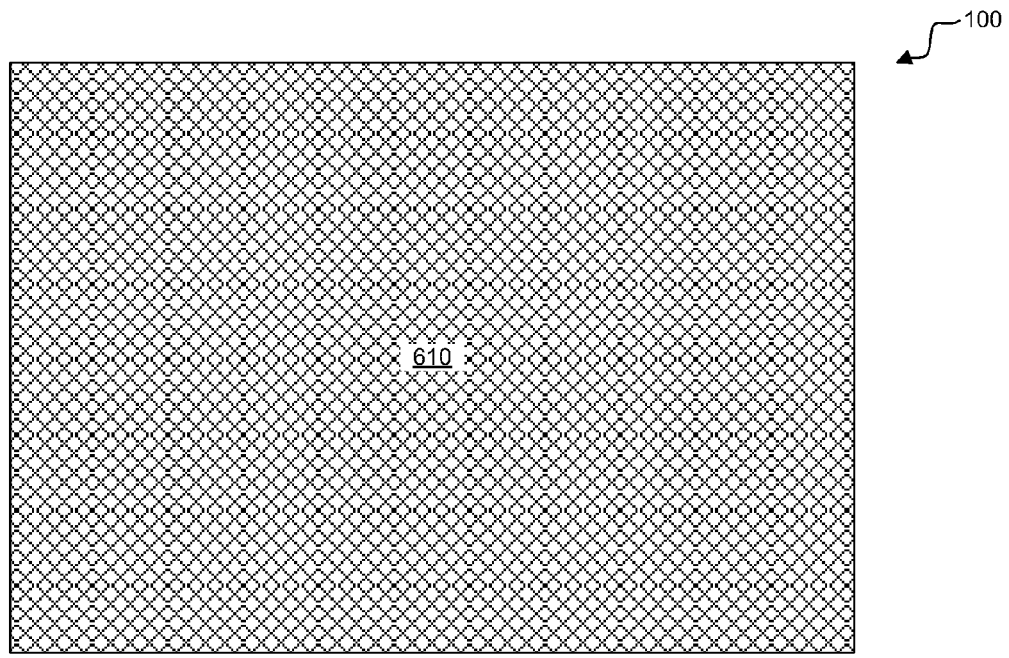
FIG. 9A is a top view and a cross-sectional view depicting forming a second masking layer above the semiconductor structure, according to an embodiment of the present invention.
Figure 9B:
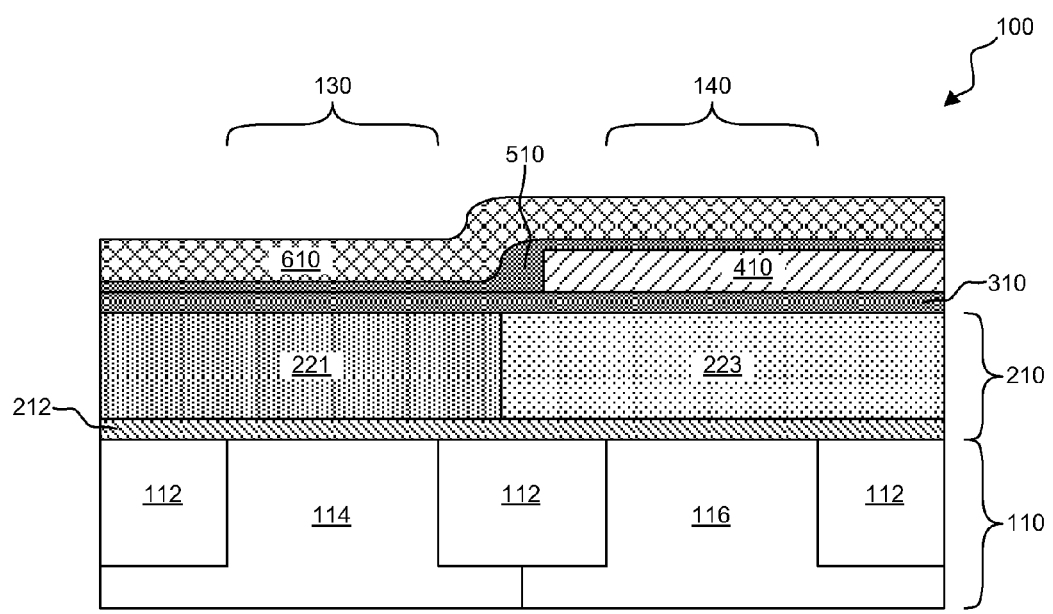
FIG. 9B is a cross-sectional view of the semiconductor structure of FIG. 9A.

Referring to FIGS. 7A-7B, a first spacer layer 510 may be formed above the semiconductor structure 100. The first spacer layer 510 may be made of any suitable material with good etch selectivity relative to the first masking layer 410 and the subsequently formed second masking layer (FIGS. 9A-9B). The first spacer layer 510 may be formed using any suitable deposition technique known in the art capable of forming a substantially conformal player over the first masking layer 410 and the protective layer 310, including, for example, CVD and PVD. The first spacer layer 510 may include a spacer region 515 formed on the end 415 of the first masking layer 410. The spacer region 515 may have an average thickness on the end 415 (i.e., measured parallel to the top surface of the semiconductor structure 100) ranging from approximately 50 nm to approximately 100 nm, though greater and lesser thicknesses are explicitly contemplated. Depending on the thickness of the spacer region 515 and the deposition process used, the thickness of the spacer region 515 may not be uniform across the end 415, whereby the thickness being greater at the bottom of the spacer region 515 and lesser at the top of the spacer region 515. In embodiments where the first spacer layer 510 is thinner, for example from approximately 10 nm to approximately 40 nm, the spacer region 515 may have a substantially uniform thickness.

Figure 8A:
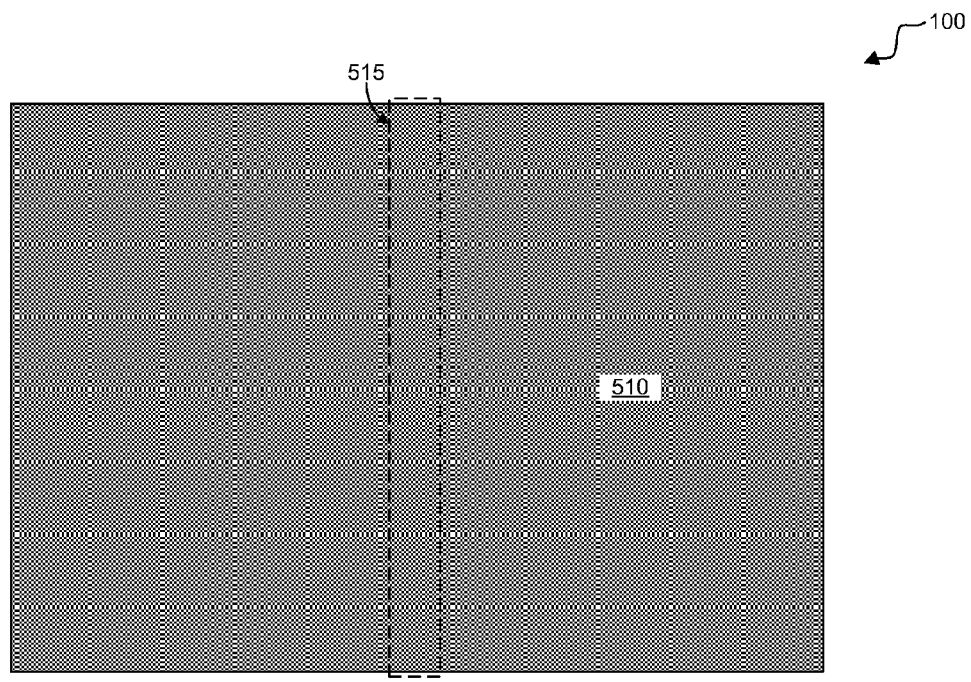
FIG. 8A is a top view and a cross-sectional view depicting doping a first portion of the semiconductor substrate, according to an embodiment of the present invention.
Figure 8B:
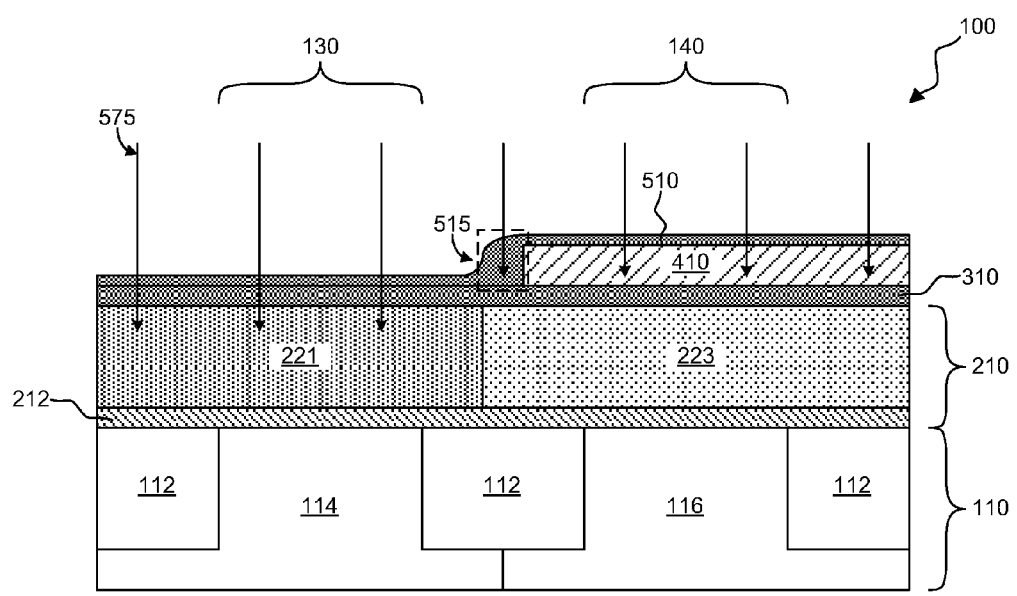
FIG. 8B is a cross-sectional view of the semiconductor structure of FIG. 8A.

Referring to FIGS. 8A-8B, the gate electrode layer 214 (FIG. 7B) may be doped in the nFET active region 130 with first dopants 575. First dopants 575 may include, for example, n-type dopants including arsenic and phosphorous, using typical doping processes, such as ion implantation. In other embodiments, such as those where the gate electrode layer 214 is a semiconductor layer not part of a CMOS device, the first dopants 575 may include p-type dopants or other dopants known in the art. Because the spacer region 515 and the first masking layer 410 may prevent the first dopants 575 from reaching the gate electrode layer 214, the doping process may result in a first doped gate electrode region 221 and a first undoped gate electrode region 223.

Referring to FIG. 9A-9B, a second masking layer 610 may be formed above semiconductor structure 100. The second masking layer 610 may be made of a material with good polish selectivity relative to the first spacer layer 510 and the first masking layer 410 and have a thickness ranging from approximately 50 nm to approximately 200 nm, though greater and lesser thicknesses are explicitly contemplated. In an exemplary embodiment, the second masking layer 610 may be made of germanium. In other embodiments, the second masking layer 610 may be made of polysilicon or a photoresist material. The second masking layer 610 may be formed using any suitable deposition technique known in the art capable of forming a substantially conformal layer over the first spacer layer 510, including, for example, CVD and PVD.

Figure 10A:
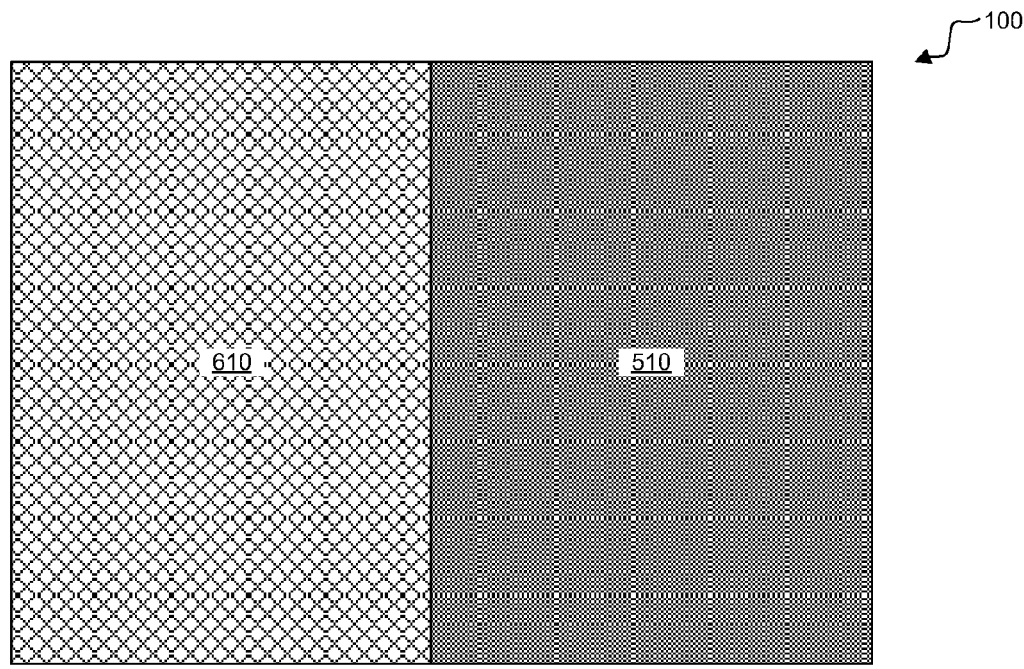
FIG. 10A is a top view and a cross-sectional view depicting planarizing the semiconductor structure, according to an embodiment of the present invention.
Figure 10B:
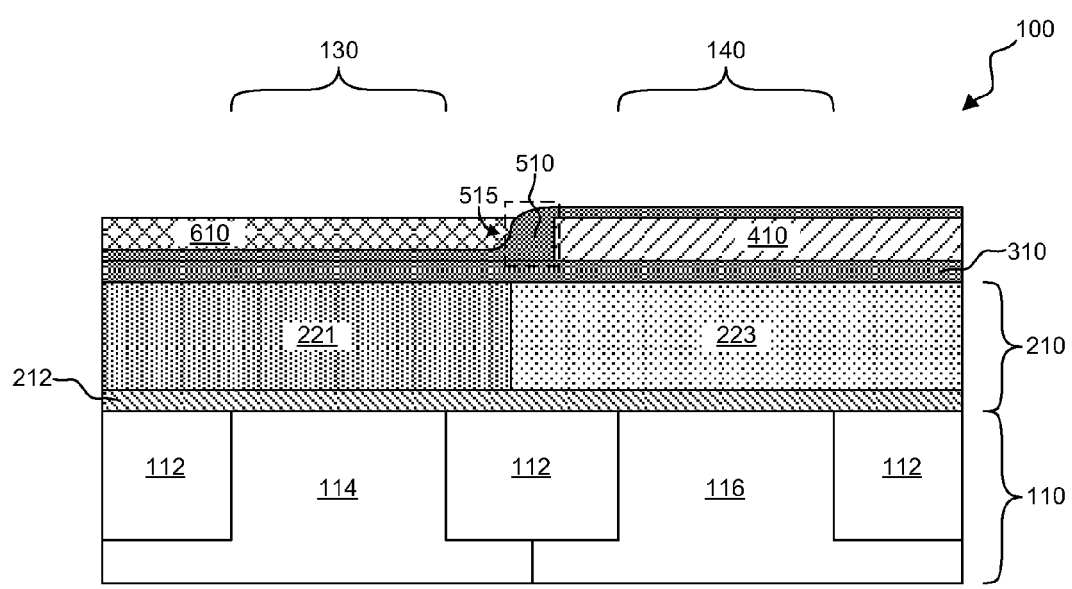
FIG. 10B is a cross-sectional view of the semiconductor structure of FIG. 10A.

Referring to FIG. 10A-10B, the semiconductor structure 100 may be planarized to remove excess material from the second masking layer 610 using the first spacer layer 510 as a polish-stop using a known planarization process such as chemical-mechanical planarization (CMP). As a result of different planarization rates, the top surface of the second masking layer 610 may be slightly below the top surface of the first spacer layer 510, for example by approximately 25 to approximately 100 nm.

Figure 11A:
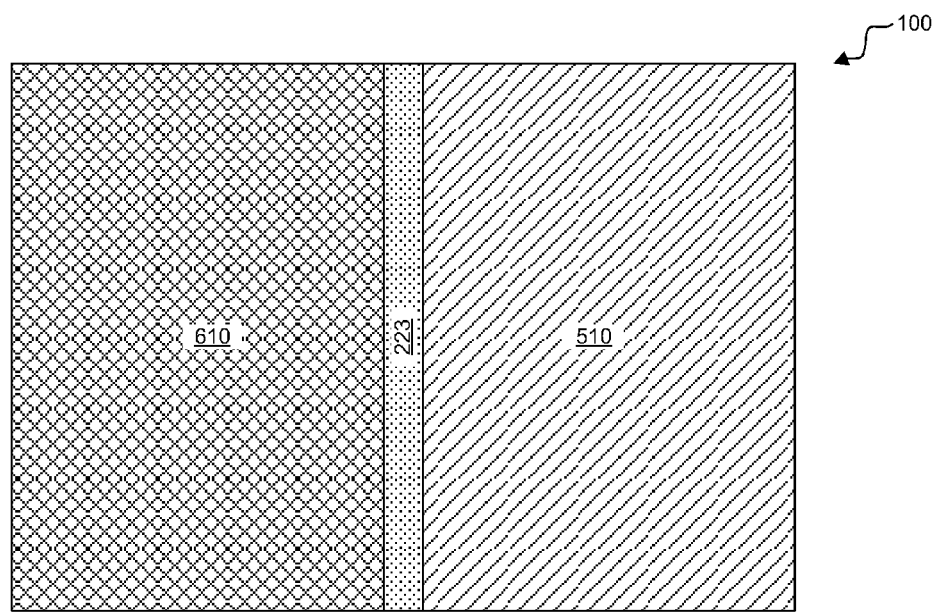
FIG. 11A is a top view and a cross-sectional view depicting etching a notch in the semiconductor structure, according to an embodiment of the present invention.
Figure 11B:
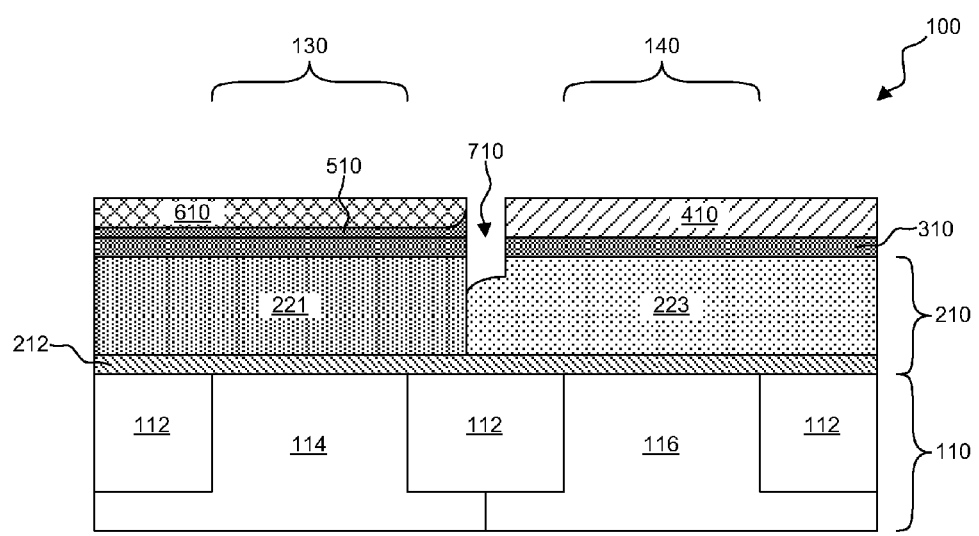
FIG. 11B is a cross-sectional view of the semiconductor structure of FIG. 11A.

Referring to FIG. 11A-11B, after planarizing the semiconductor structure 100, the first spacer layer 510 and the protective layer 310 may be etched to form a notch 710 between the first masking layer 410 and the second masking layer 610. The notch 710 may be formed using any typical anisotropic etching process capable of etching the first spacer layer 510 and the protective layer 310 while not substantially etching the first masking layer 410 and the second masking layer 610. Exemplary etching processes may include reactive ion etching (RIE), plasma etching, or chemical vapor etching (CVE). Because the etching process will not remove material from the first masking layer 410 or the second masking layer 610, the width of the notch 710 may be determined by the width of the spacer region 515 exposed during the previous planarization process. As a result of the etching process, the first spacer layer 510 may also be removed from above the first masking layer 410.

With continued reference to FIG. 11A-11B, the notch 710 may extend at least partially into the gate layer 210 due to overetching. In some embodiments, it may be desirable to overetch into the gate layer 210 so that the notch 710 separates a portion of the first doped gate electrode region 221 from the subsequently formed p-doped gate electrode region. The depth of the overetching may range from approximately 10 nm to approximately 40 nm, though greater and lesser depths are explicitly contemplated. Further, the notch 710 may have an asymmetrical shape due to the shape of the spacer region 515 (FIGS. 8A-8B). As previously discussed, the spacer region 515 may have a substantially uniform thickness, in which case the notch 710 will be substantially symmetrical. However, in embodiments where the spacer region 515 has a greater thickness at the bottom of the spacer region 515, the notch 710 may increase in depth as the lateral distance from the first masking region 410 increases.

Figure 12A:
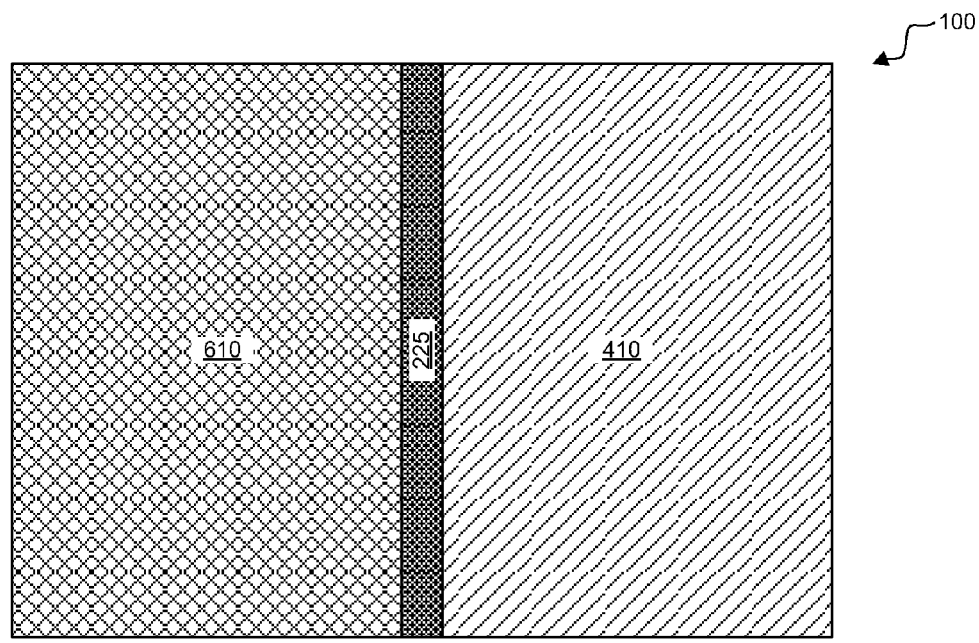
FIG. 12A is a top view and a cross-sectional view depicting forming a barrier region in the semiconductor structure, according to an embodiment of the present invention.
Figure 12B:
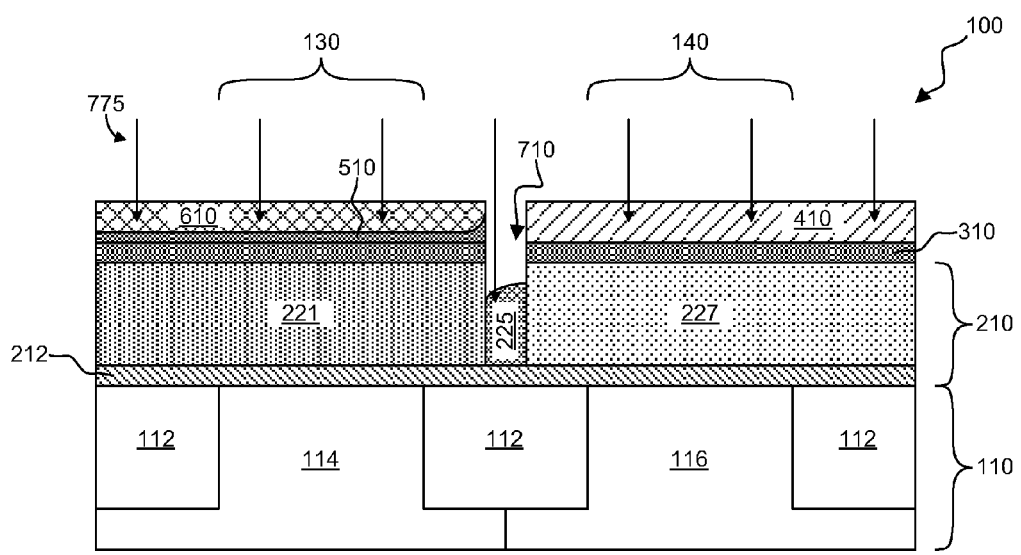
FIG. 12B is a cross-sectional view of the semiconductor structure of FIG. 12A.

Referring to FIG. 12A-12B, the first undoped gate electrode region 223 (FIG. 11A-11B) may be doped below the notch region with barrier dopants 775 using typical doping processes, such as ion implantation, to form a barrier region 225. The barrier region 225 may prevent dopants from migrating from the first doped gate electrode region 221 into the second undoped gate electrode region 227. Exemplary barrier dopants may include electrically inert atoms such as, carbon, oxygen, nitrogen, or fluorine. Because the first masking layer 410 and the second masking layer block the barrier dopants 775, the barrier region 225 is self-aligned to the notch 710. After the doping process, a second undoped gate electrode region 227 remains, covered by the first masking region 410.

Figure 13A:
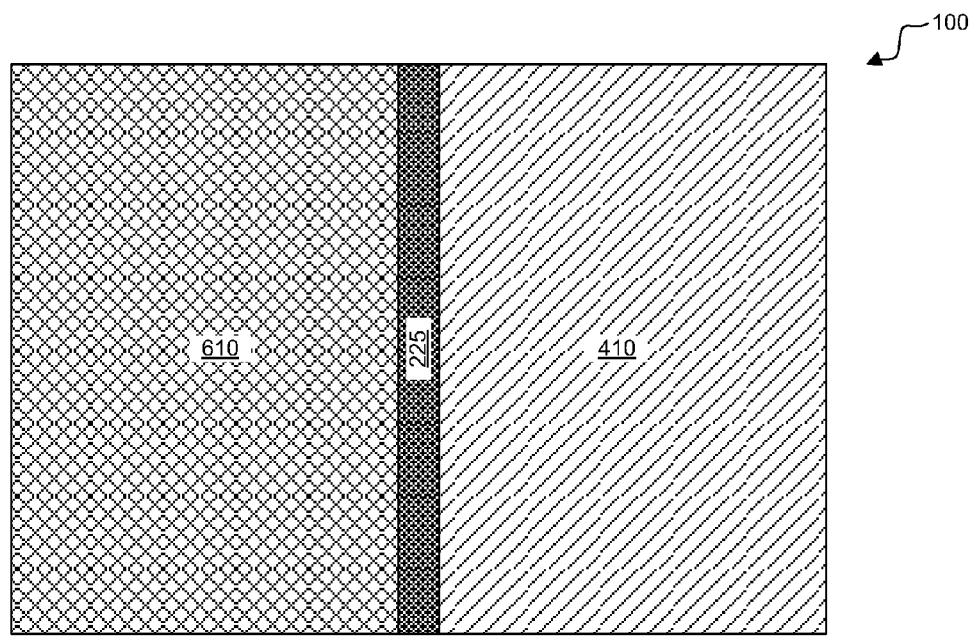
FIG. 13A is a top view and a cross-sectional view depicting removing the first masking layer, according to an embodiment of the present invention.
Figure 13B:
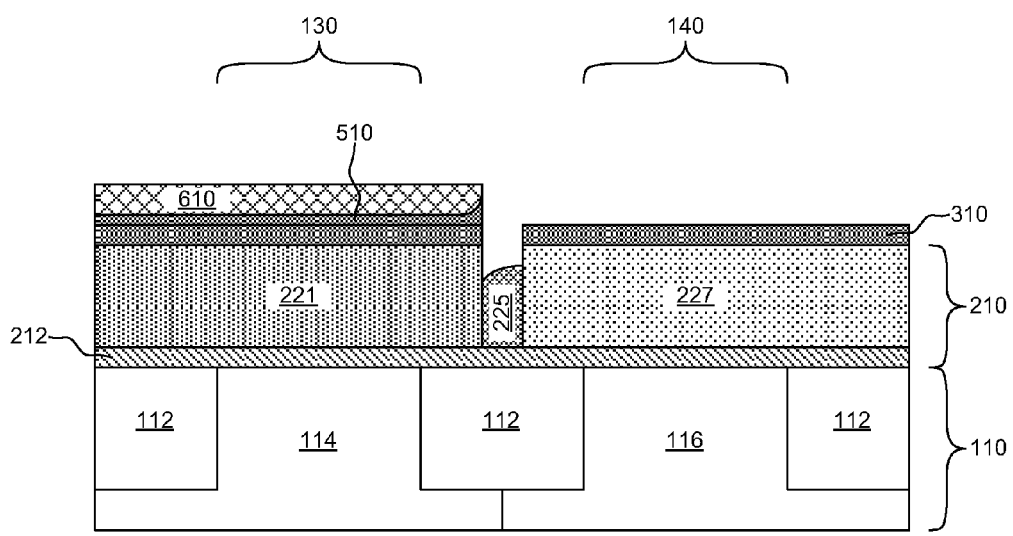
FIG. 13B is a cross-sectional view of the semiconductor structure of FIG. 13A.

Referring to FIG. 13A-13B, the first masking layer 410 may be removed using any suitable typical etching process known in the art. For example, in embodiments where the first masking layer 410 is made of silicon oxide, the first masking layer 410 may be removed using a hydrofluoric acid wet etch.

Figure 14A:
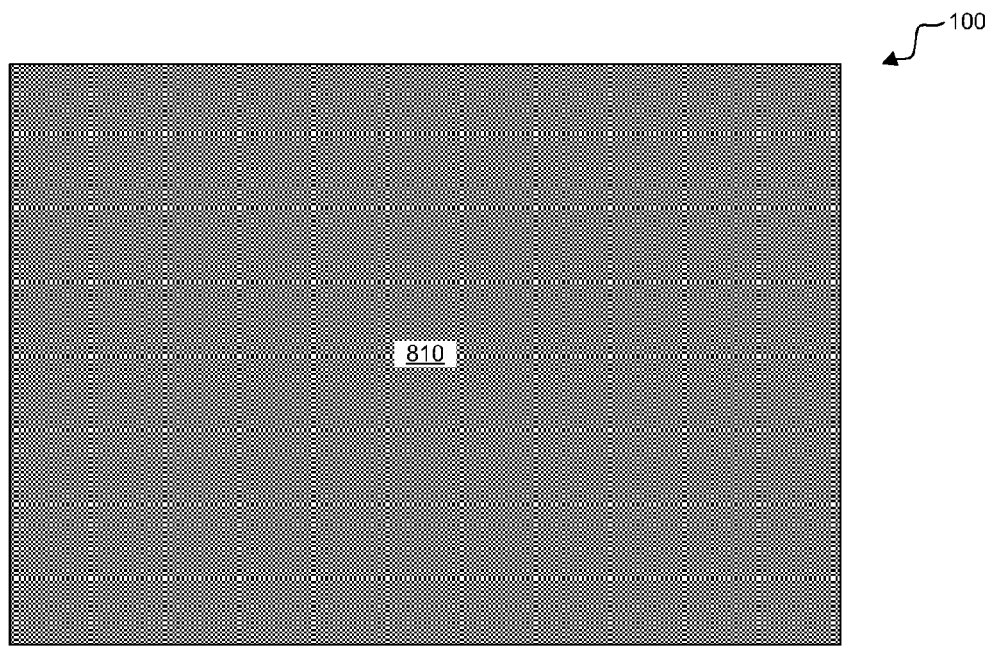
FIG. 14A is a top view and a cross-sectional view depicting forming a second spacer layer above the semiconductor structure, according to an embodiment of the present invention.
Figure 14B:
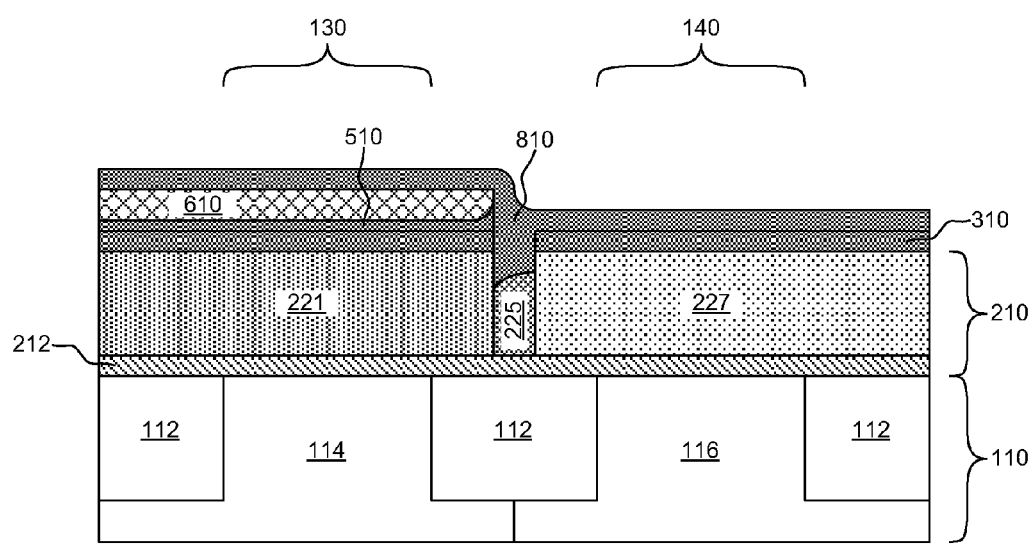
FIG. 14B is a cross-sectional view of the semiconductor structure of FIG. 14A.

Referring to FIG. 14A-14B, a second spacer layer 810 may be formed above the semiconductor structure 100. The second spacer layer 810 may be made of any material with good etch selectivity relative to the gate electrode layer 214 (FIG. 7A-7B) and formed using typical deposition processes, for example CVD or PVD. In an exemplary embodiment, the second spacer layer 810 is made of the same material as the protective layer 310 and the first spacer layer 510. The second spacer layer 810 should have a thickness above the barrier region 225 sufficient to prevent doping of the barrier region 225 during subsequent processing steps while not preventing doping of the second undoped gate electrode region 227. The second spacer layer 810 may have a minimum thickness of approximately 300 nm above the barrier region 225, and a thickness of approximately 30 nm to approximately 100 nm above the second undoped gate electrode region 227.

Figure 15A:
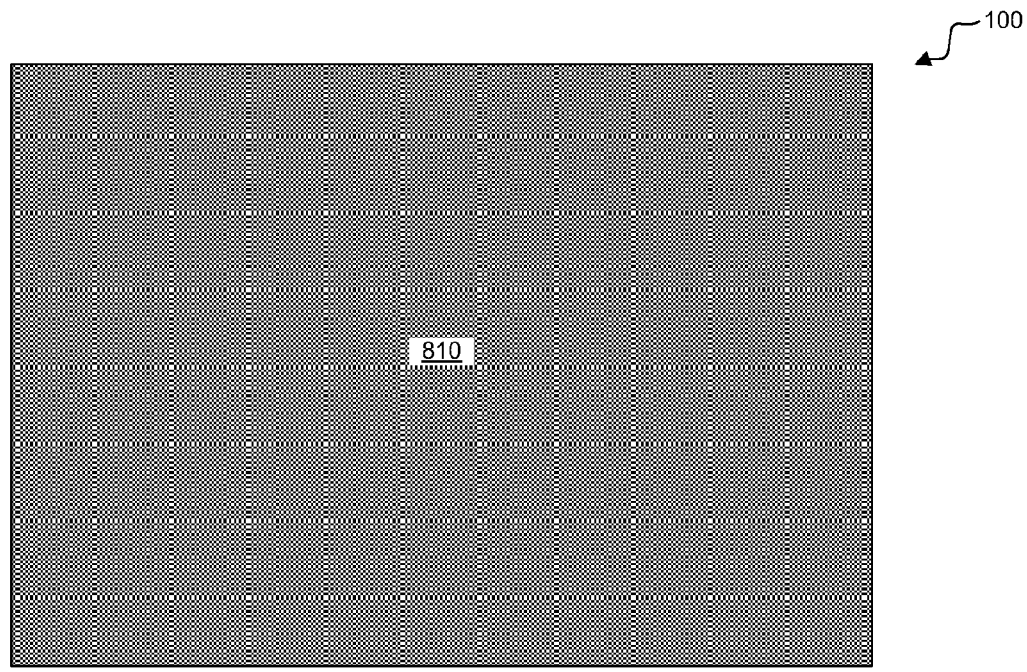
FIG. 15A is a top view and a cross-sectional view depicting doping a second portion of the semiconductor substrate, according to an embodiment of the present invention.
Figure 15B:
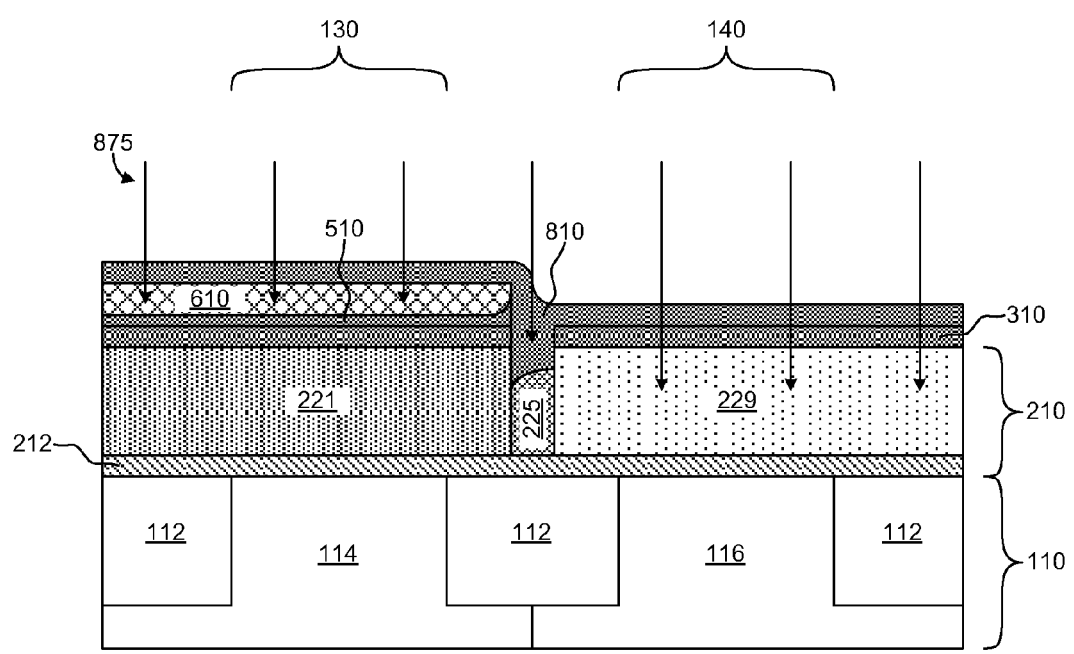
FIG. 15B is a cross-sectional view of the semiconductor structure of FIG. 15A.

Referring to FIG. 15A-15B, the second undoped gate electrode region 227 (FIG. 14B) may be doped in the pFET active region 140 with second dopants 875 using typical doping processes, such as ion implantation, to form a second doped region 229. Second dopants 875 may include, for example, p-type dopants, including for example, boron. In other embodiments, such as those where the gate electrode layer 214 (FIG. 7B) is a semiconductor layer not part of a CMOS device, the first dopants 575 may include n-type dopants or other dopants known in the art. The second masking layer 610 and the second spacer layer 810 may block dopants from reaching the first doped gate electrode region 221 or the barrier region 225 so that the dopants are only implanted in the second undoped gate electrode region 227, now labeled as the second doped region 229.

Figure 16A:
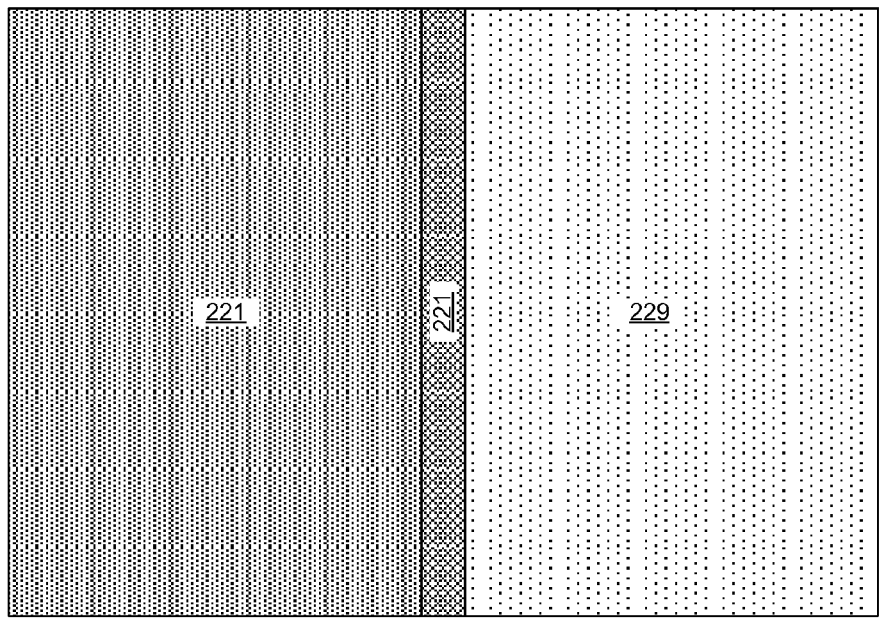
FIG. 16A is a top view and a cross-sectional view depicting removing the protective layer, the first spacer layer, the second masking layer, and the second spacer layer from the semiconductor structure; according to an embodiment of the present invention.
Figure 16B:
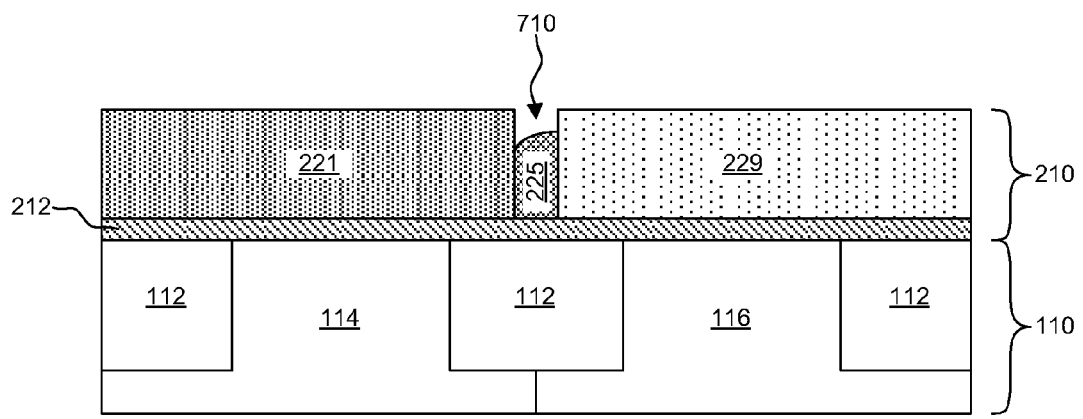
FIG. 16B is a cross-sectional view of the semiconductor structure of FIG. 16A.

Referring to FIG. 16A-16B, any remaining layers, including the protective layer 310 (FIG. 15B), the first spacer layer 510 (FIG. 15B), the second masking layer 610 (FIG. 15B), and the second spacer layer 810 (FIGS. 15A-15B), may be removed from above the first doped region 221, the barrier region 225, and the second doped region 229. The remaining layers may be removed by any typical etching process suitable for removing the remaining layers without damaging the gate layer 210, including, for example, a hydrofluoric acid or phosphoric acid wet etch.

With continued reference to FIG. 16A-16B, the resulting semiconductor structure 100 has a gate layer 210 including the first doped region 221, the second doped region 229, and a barrier region 225 separating the first doped region 221 and the second doped region 229. The first doped region 221 contains a first dopant, the second doped region 229 contains a second dopant, and the barrier region 225 contains a barrier dopant that prevents the first dopant from diffusing into the second doped region 229 and the second dopant from diffusing into the first doped region 221. Because the method described above in conjunction with FIGS. 1-15 self-aligns the barrier region 225 between the first doped region 221 and the second doped region 229, the barrier region 225 may have a width less than could be achieved using typical lithographic processes. Further, because both the first doped region 221 and the second doped region 229 are covered by the second masking layer 610 (FIGS. 15A-15B) and the first masking layer 410 (FIGS. 8A-8B), respectively, while being doped, the possibility of any unintended cross-doping may also be reduced. The semiconductor structure 100 may include a notch 710 above the barrier region 225. The notch 710 may help further separate the first doped region 221 and the second doped region 229 and prevent dopant diffusion. For the same reason as the barrier region 225, the notch 710 may have a width less than could be achieved using typical lithographic processes.

After removing any layers from above the first doped region 221, the barrier region 225, and the second doped region 229, further typical CMOS processing may occur, including, for example, patterning the gate layer 210, forming spacers on the patterned gate layer 210, doping or growing source/drain regions, and depositing interlevel dielectric layers (ILDs). During one of these processes, or during a dedicated process for the purpose, the notch 710 may be filled with an insulating material, including for example silicon nitride. The filled notch 710 may form an insulating barrier between the first doped region 221 and the second doped region 229.

Figure 17:
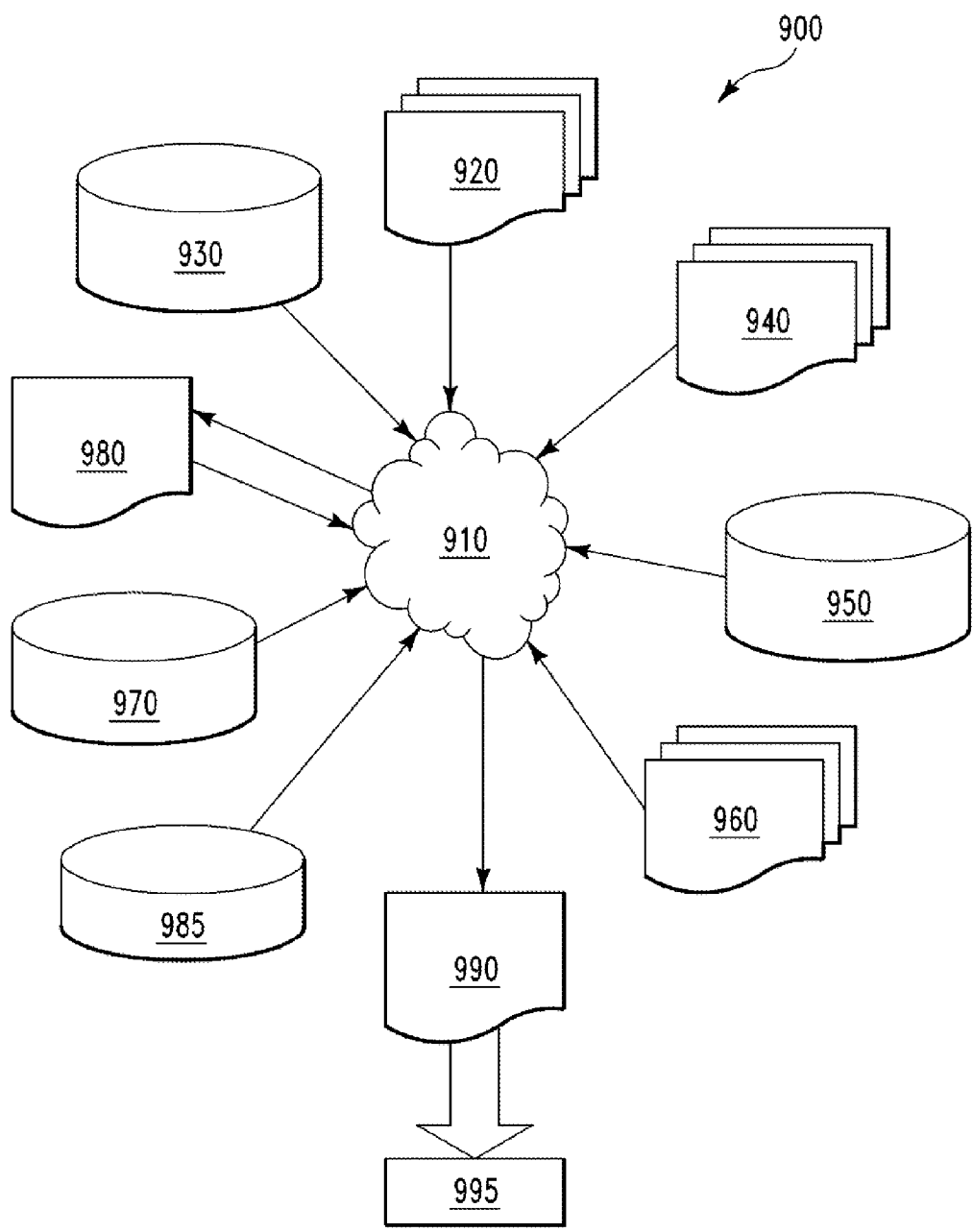
FIG. 17 is a flow diagram of a design process used in semiconductor design, manufacture, and/or test according to an embodiment of the present invention.

FIG. 17 shows a block diagram of an exemplary design flow 900 used for example, in semiconductor IC logic design, simulation, test, layout, and manufacture. Design flow 900 includes processes and mechanisms for processing design structures or devices to generate logically or otherwise functionally equivalent representations of the design structure and/or device described above and shown in FIGS. 16A-16B. The design structure processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems.

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 17 illustrates multiple such design structures including an input design structure 920 that is preferably processed by a design process 910. In one embodiment, the design structure 920 comprises design data used in a design process and comprising information describing one or more embodiments of the invention with respect to the structure as shown in FIGS. 16A-16B. The design data in the form of schematics or HDL, a hardware-description language (e.g., Verilog, VHDL, C, etc.) may be embodied on one or more machine readable media. For example, design structure 920 may be a text file, numerical data or a graphical representation of the one or more embodiments of the invention, as shown in FIGS. 16A-16B. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as those implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as that shown FIGS. 16A-16B. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structure shown in FIGS. 16A-16B to generate a netlist 980 which may contain a design structure such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 20 nm, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990 comprising second design data embodied on a storage medium in a data format used for the exchange of layout data of integrated circuits and/or symbolic data format (e.g. information stored in a GDSII (GDS2), GL1, OASIS, map files, or any other suitable format for storing such design structures). In one embodiment, the second design data resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 16A-16B. In one embodiment, design structure 990 may comprise a compiled, executable HDL simulation model that functionally simulates the device shown in FIGS. 16A-16B.

Design structure 990 may also employ a data format used for the exchange of layout data of integrated circuits and/or symbolic data format (e.g., information stored in a GDSII (GDS2), GL1, OASIS, map files, or any other suitable format for storing such design data structures).

Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce the device or structure as described above and shown in FIGS. 16A-16B. Design structure 990 may then proceed to a stage 995 where, for example, design structure 990: proceeds to tape-out, is released to manufacturing, is released to a mask house, is sent to another design house, is sent back to the customer, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A semiconductor structure comprising:
    a semiconductor layer comprising a first doped region including a first dopant and a second doped region including a second dopant; and
    a diffusion barrier separating the first doped region and the second doped region,
    wherein the diffusion barrier comprises a third doped region including a third dopant different from the first dopant and the second dopant and a notch above the third doped region, wherein the notch has an asymmetric profile from a side view, wherein the notch forms a gap separating the first doped region and the second doped region,
    wherein the first doped region and the second doped region are oppositely doped,
    wherein the third doped region is a different region than the first doped region and the second doped region,
    wherein the first doped region is a different region than the second doped region,
    wherein the diffusion barrier is self-aligned between the first doped region and the second doped region.

2. The structure of claim 1, wherein the notch is filled with silicon nitride.

3. The structure of claim 1, wherein the third doped region of the diffusion barrier comprises a barrier dopant selected from the group consisting of: carbon, oxygen, nitrogen, and fluorine.

4. The structure of claim 1, wherein first doped region and the second doped region are covered by a masking layer.

5. The structure of claim 1, wherein the third doped region includes a curved profile.

* * * * *